(12) United States Patent
Jeong

(10) Patent No.: US 9,711,538 B2
(45) Date of Patent: Jul. 18, 2017

(54) DISPLAY DEVICE

(71) Applicant: LG Display Co., Ltd., Seoul (KR)

(72) Inventor: Ilgi Jeong, Cheongwon-gun (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/229,450

(22) Filed: Aug. 5, 2016

(65) Prior Publication Data

US 2017/0040345 A1 Feb. 9, 2017

(30) Foreign Application Priority Data

Aug. 7, 2015 (KR) .................. 10-2015-0111868

(51) Int. Cl.
*H01L 27/12* (2006.01)
*G09G 3/20* (2006.01)

(52) U.S. Cl.
CPC ......... *H01L 27/124* (2013.01); *G09G 3/2092* (2013.01); *G09G 2310/027* (2013.01); *G09G 2310/08* (2013.01)

(58) Field of Classification Search
CPC ................ H01L 27/124; G09G 3/2092; G09G 2310/027
See application file for complete search history.

(56) References Cited

U.S. PATENT DOCUMENTS

| 6,172,410 B1 * | 1/2001 | Nagata | G02F 1/1309 257/350 |
| 7,777,854 B2 * | 8/2010 | Moon | G02F 1/1345 345/104 |

* cited by examiner

*Primary Examiner* — David Vu
(74) *Attorney, Agent, or Firm* — Polsinelli PC

(57) ABSTRACT

A display device includes two or more pixels disposed in a pixel area in which two or more data lines intersect two or more gate lines; a common electrode commonly disposed on the pixels; a first gate high voltage supplied through a first gate voltage line, a portion of the first gate high voltage overlapping the common electrode; a second gate high voltage supplied through a second gate voltage line, a portion of the second gate high voltage overlapping the common electrode; a connecting line structure in contact with the common electrode, and extending from the common electrode in a direction toward a position in which the common electrode does not overlap the first gate voltage line.

19 Claims, 17 Drawing Sheets

STAGE

DISPLAY DEVICE

CROSS REFERENCE TO RELATED APPLICATION

This application claims priority under U.S.C §119(a) to Korean Patent Application Number 10-2015-0111868 filed in the Republic of Korea on Aug. 7, 2015, which is hereby incorporated by reference in its entirety.

BACKGROUND

Field of the Disclosure

The present disclosure relates to a display device for displaying images, and more particularly, to a display device capable of supplying the same gate voltage through two gate voltage lines regardless of the shapes, positions, or structures of the two gate voltage lines.

Discussion of the Related Art

In response to the development of the information society, demand for a variety of display devices for displaying images is increasing. In this regard, a range of display devices, such as liquid crystal display (LCD) devices, plasma display panels (PDPs), and organic light-emitting display devices (OLEDs), are used.

Such a display device has electrical lines or wirings arranged on a substrate, where a signal or a voltage is supplied. When the same signal or the same voltage is supplied through two or more lines, the respective signals or voltages supplied through the two or more lines may not be the same, depending on the shapes, positions, or structures of the two or more lines.

Since the same signals or voltages may not be supplied through the two or more lines, even though the two or more lines are supposed to supply the same signal or voltage from a display device, a variety of problems may arise.

SUMMARY

Accordingly, the present disclosure is directed to a display device able to supply the same gate high voltage through two gate voltage lines regardless of the shapes, positions, or structures of the two gate voltage lines.

According to an aspect of the present disclosure, a display device may include: two or more pixels disposed in a pixel area in which two or more data lines intersect two or more gate lines; a common electrode commonly disposed on the pixels; a first gate voltage line through which a first gate high voltage is supplied, a portion of the first gate voltage line overlapping the common electrode; a second gate voltage line through which a second gate high voltage is supplied, a portion of the second gate voltage line overlapping the common electrode; and a connecting line structure in contact with the common electrode, the connecting line structure extending from the common electrode in a direction toward a position in which the common electrode does not overlap the first gate voltage line.

Additional features and advantages of the disclosure will be set forth in the description which follows, and in part will be apparent from the description, or may be learned by practice of the disclosure. The objectives and other advantages of the disclosure will be realized and attained by the structure particularly pointed out in the written description and claims hereof as well as the appended drawings.

According to the present disclosure as set forth above, the display device is able to supply the same gate high voltage through two gate voltage lines regardless of the shapes, positions, or structures of the two gate voltage lines.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Figure 1:
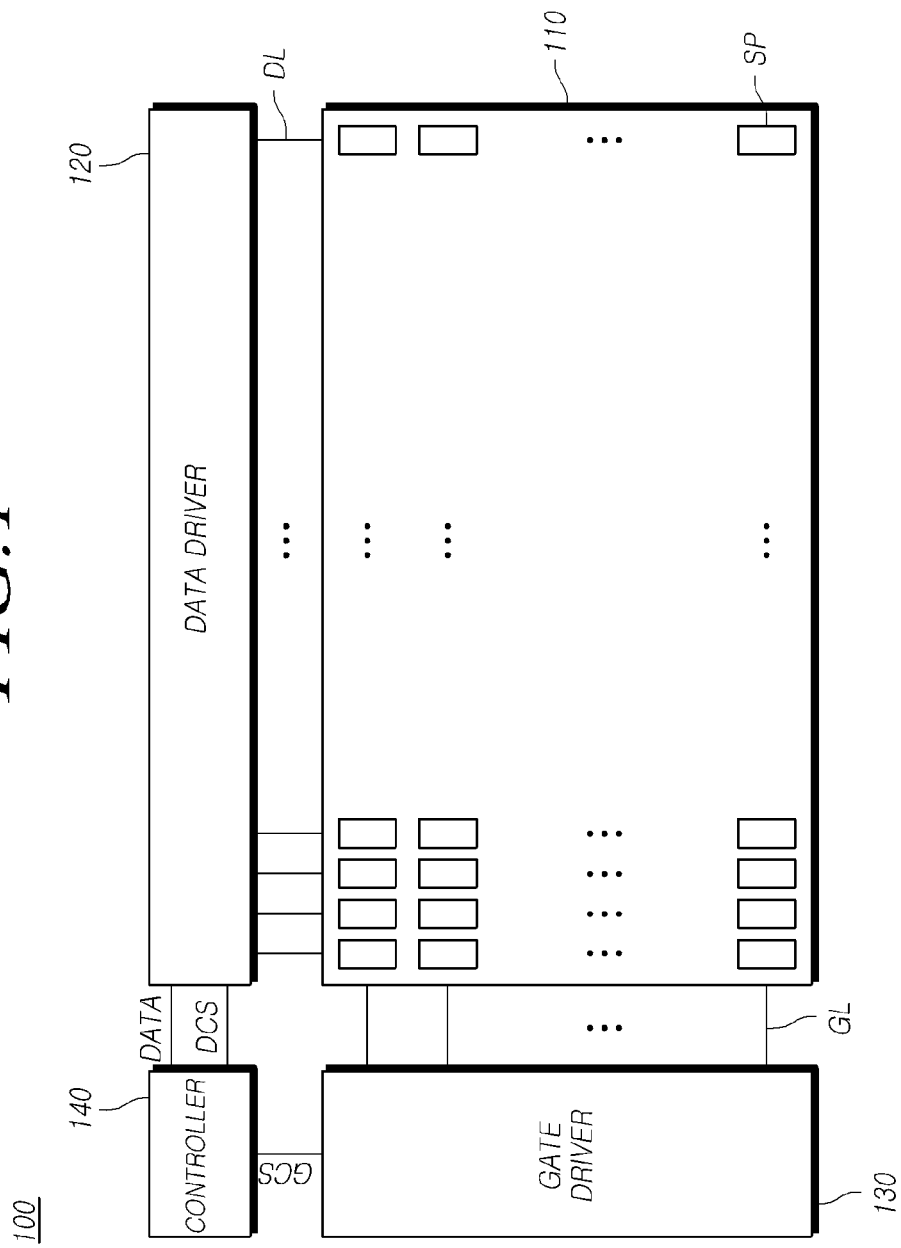
FIG. 1 schematically illustrates the configuration of a display device according to exemplary embodiments.

Hereinafter, reference will be made to embodiments of the present disclosure in detail, examples of which are illustrated in the accompanying drawings. Throughout this document, reference should be made to the drawings, in which the same reference numerals and signs will be used to designate the same or like components. In the following description of the present disclosure, detailed descriptions of known functions and components incorporated herein will be omitted in the case that the subject matter of the present disclosure may be rendered unclear thereby.

It will also be understood that, while terms such as "first," "second," "A," "B," "(a)," and "(b)" may be used herein to describe various elements, such terms are only used to distinguish one element from another element. The substance, sequence, order or number of these elements is not limited by these terms. It will be understood that when an element is referred to as being "connected to" or "coupled to" another element, not only can it be "directly connected or coupled to" the other element, but it can also be "indirectly connected or coupled to" the other element via an "intervening" element. In the same context, it will be understood that when an element is referred to as being formed "on" or "under (or below)" another element, not only can it be directly formed on or under (or below) another element, but it can also be indirectly formed on or under (or below) another element via an intervening element.

FIG. 1 schematically illustrates the configuration of a display device 100 according to exemplary embodiments.

Referring to FIG. 1, the display device 100 according to the exemplary embodiments includes: a display panel 110 on which a plurality of data lines DL and a plurality of gate lines GL are arranged and a plurality of pixels are arranged in the form of a matrix; a data driver circuit 120 driving the plurality of data lines DL by supplying data voltages thereto; a gate driver circuit 130 sequentially driving the plurality of gate lines by sequentially supplying gate signals thereto; a controller 140 controlling the data driver circuit 120 and the gate driver circuit 130; and so on.

The controller 140 controls the data driver circuit 120 and the gate driver circuit 130 by supplying a variety of control signals DCS and GCS thereto.

The controller 140 starts scanning based on timing realized by each frame, converts image data input by an external source into a data signal format readable by the data driver circuit 120, outputs the converted image data, and at a suitable point in time, controls data processing in response to the scanning.

The controller 140 may include one timing controller or more.

The gate driver circuit 130 sequentially drives the plurality of gate lines by sequentially supplying gate signals having an on voltage (hereinafter referred to as a "gate high voltage Vgh") or an off voltage (hereinafter referred to as a "gate low voltage Vgl") thereto, under the control of the controller 14.

The gate driver circuit 130 may be positioned on one side of the display panel 110, as illustrated in FIG. 1, or on both sides of the display panel 110, depending on the driving system.

In addition, the gate driver circuit 130 may include one or more gate driver integrated circuits (ICs).

Each of the gate driver ICs may be connected to the bonding pads of the display panel 110 by tape automated bonding (TAB) or chip on glass (COG) bonding, or it may be implemented as a gate in panel (GIP)-type IC directly disposed on the display panel 110. Alternatively, it may be integrated with the display panel 110.

Each of the gate driver ICs may include a shift register, a level shifter, and so on.

The data driver circuit 120 drives a plurality of data lines by converting image data DATA received from the controller into analog data voltages and supplying the analog data voltages to the plurality of data lines when a specific gate line is opened.

The data driver circuit 120 may include one or more source driver ICs (or data driver ICs) to drive the plurality of data lines.

Each of the source driver ICs may be connected to the bonding pads of the display panel 110 by tape automated bonding (TAB) or chip on glass (COG) bonding, may be directly disposed on the display panel 110, or in some cases, it may be integrated with the display panel 110. Each of the source driver ICs may be formed by chip on film (COF) processing. In this case, one end of each of the source driver ICs is connected to at least one source printed circuit board (S-PCB), while the other end of each of the source driver ICs is bonded to the display panel 110.

Each of the source driver ICs may include a logic circuit, a digital-to-analog converter (DAC), an output buffer, and so on. The logic circuit includes a shift register, a latch circuit, and so on. In some cases, each of the source driver ICs may further include a sensing circuit (e.g., sensor) for sensing the characteristics of a corresponding pixel such as the threshold voltage and mobility of a driving transistor, the threshold voltage of a display element, the luminance of the corresponding subpixel, and so on, to compensate for the pixel characteristics.

The controller 140 receives a variety of timing signals, including a vertical synchronization signal Vsync, a horizontal synchronization signal Hsync, an input data enable (DE) signal, and a clock signal, as well as input image data, from an external source (e.g. a host system).

The controller 140 not only outputs image data input from the external source by converting the image data into a data signal format readable by the data driver circuit 120, but also generates a variety of control signals by receiving a variety of timing signals, including a vertical synchronization signal Vsync, a horizontal synchronization signal Hsync, an input DE signal, and a clock signal, and outputs the variety of control signals to the data driver circuit 120 and the gate driver circuit 130 to control the same.

For example, the controller 140 outputs a variety of gate control signals (GCSs), including a gate start pulse (GSP), a gate shift clock (GSC) signal, and a gate output enable (GOE) signal, to control the scanning driver circuit 130.

Here, the GSP controls the operation start timing of one or more gate driver ICs of the gate driver circuit 130. The GSC signal is a clock signal commonly input to the gate driver ICs to control the shift timing of scanning signals (gate pulses). The GOE signal designates the timing information of one or more gate driver ICs.

In addition, the controller 140 outputs a variety of data control signals (DCSs), including a source start pulse (SSP), a source sampling clock (SSC) signal, and a source output enable (SOE) signal, to control the data driver circuit 120.

Here, the SSP controls the data sampling start timing of one or more source driver ICs of the data driver circuit 120. The SSC signal is a clock signal controlling the data sampling timing of each of the source driver ICs. The SOE signal controls the output timing of the data driver circuit 120.

Referring to FIG. 1, the controller 140 may be disposed on a control printed circuit board (C-PCB) to which the S-PCB, having the source driver ICs bonded thereto, is connected via a connecting medium, such as a flexible flat cable (1-1-C) or a flexible printed circuit (FPC). The C-PCB may have a power controller (not shown) disposed thereon. The power controller supplies a variety of voltages or currents to the display panel 110, the data driver circuit 120, the gate driver circuit 130, and so on, or controls the supply of the variety of voltages or currents to the same. The power controller is also referred to as a power management IC (PMIC).

The S-PCB and the C-PCB as described above may be integrated as a single PCB.

Each of the plurality of pixels, disposed on the display panel 110 according to the exemplary embodiments, may include display elements, such as organic light-emitting diodes (OLEDs) and a liquid crystal cell, and circuit elements for driving the display elements, such as a driving transistor (DRT) and a storage capacitor.

The types and number of the circuit elements of the pixels may be determined variously, depending on functions provided thereby, the designs thereof, and so on.

Figure 2:
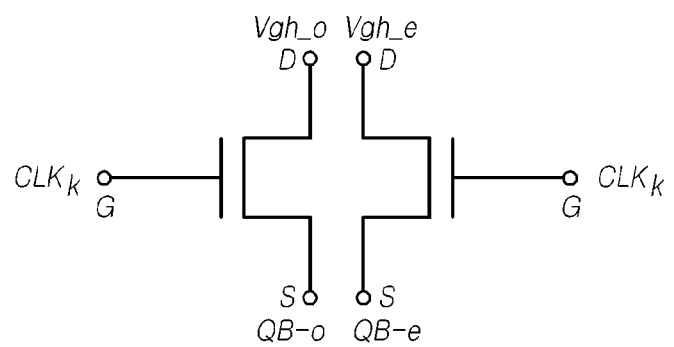
FIG. 2 is a circuit diagram illustrating an exemplary Nth stage circuit of the shift register used in each of the gate driver ICs.

FIG. 2 is a circuit diagram illustrating an exemplary Nth stage circuit of the shift register used in each of the gate driver ICs.

Referring to FIG. 2, each of the gate driver ICs includes two or more stages, including a shift register, to drive each of gate lines. Each of the gate driver ICs sequentially drives each of gate lines in response to a GSP.

When a GSP is supplied to each of the gate driver ICs, the gate driver ICs sequentially supply gate signals to the gate lines on the display panel 110, whereby the gate lines are sequentially driven. Then, a specific number of driving transistors corresponding to a single gate line, among the driving transistors on the display panel 110, are sequentially driven, whereby data signals are sequentially supplied to specific display elements corresponding to the single gate line.

The stage circuit included in the shift register illustrated in FIG. 2 can drive two pull-down driving sections QB-o and QB-e by applying two gate high voltages Vgh_o and Vgh_e thereto in an alternating manner depending on frames.

Here, the first gate high voltage Vgh_o, applied when odd numbered frames of the display panel 110 operate, and the second gate high voltage Vgh_e, applied when even numbered frames operate, are DC voltages having opposite phases. The pulse duration time of each voltage is a one-frame period or longer.

In describing its operation, when the display panel 110 operates in an odd numbered frame, the first gate high voltage Vgh_o is input into the first pull-down driving section to be output as a gate signal. Afterwards, when the display panel 110 operates in an even numbered frame, the second gate high voltage Vgh_e is input into the second pull-down driving section to be output as a gate signal.

Bias stress applied to the pull-down driving sections of the shift register stage circuit is canceled by the first gate high voltage Vgh_o and the second gate high voltage Vgh_e, which are reversed relative to each other, due to the alternating odd and even numbered frames.

Figure 3:
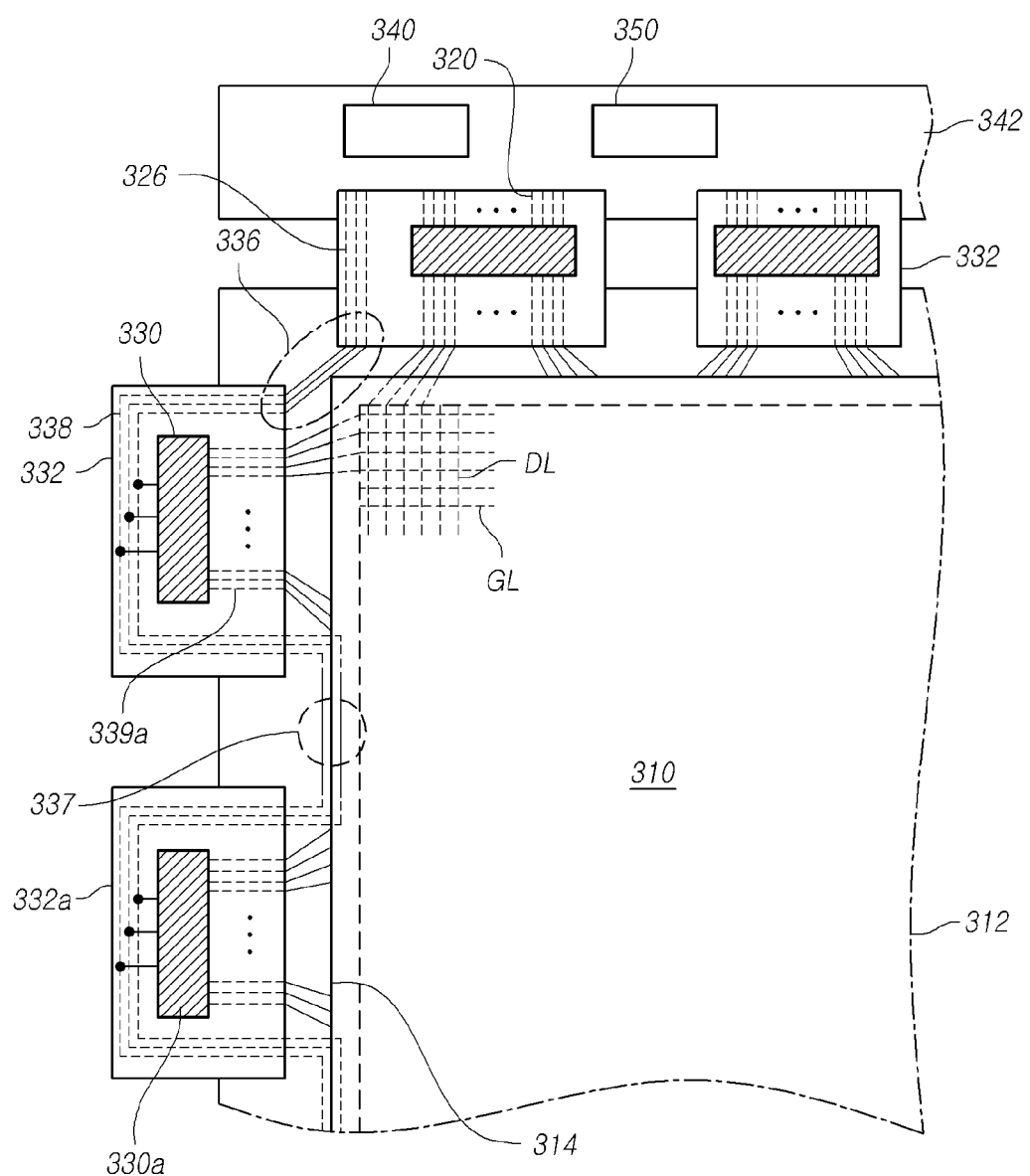
FIG. 3 is a plan view illustrating some components and lines of the display device illustrated in FIG. 1.
Figure 4:
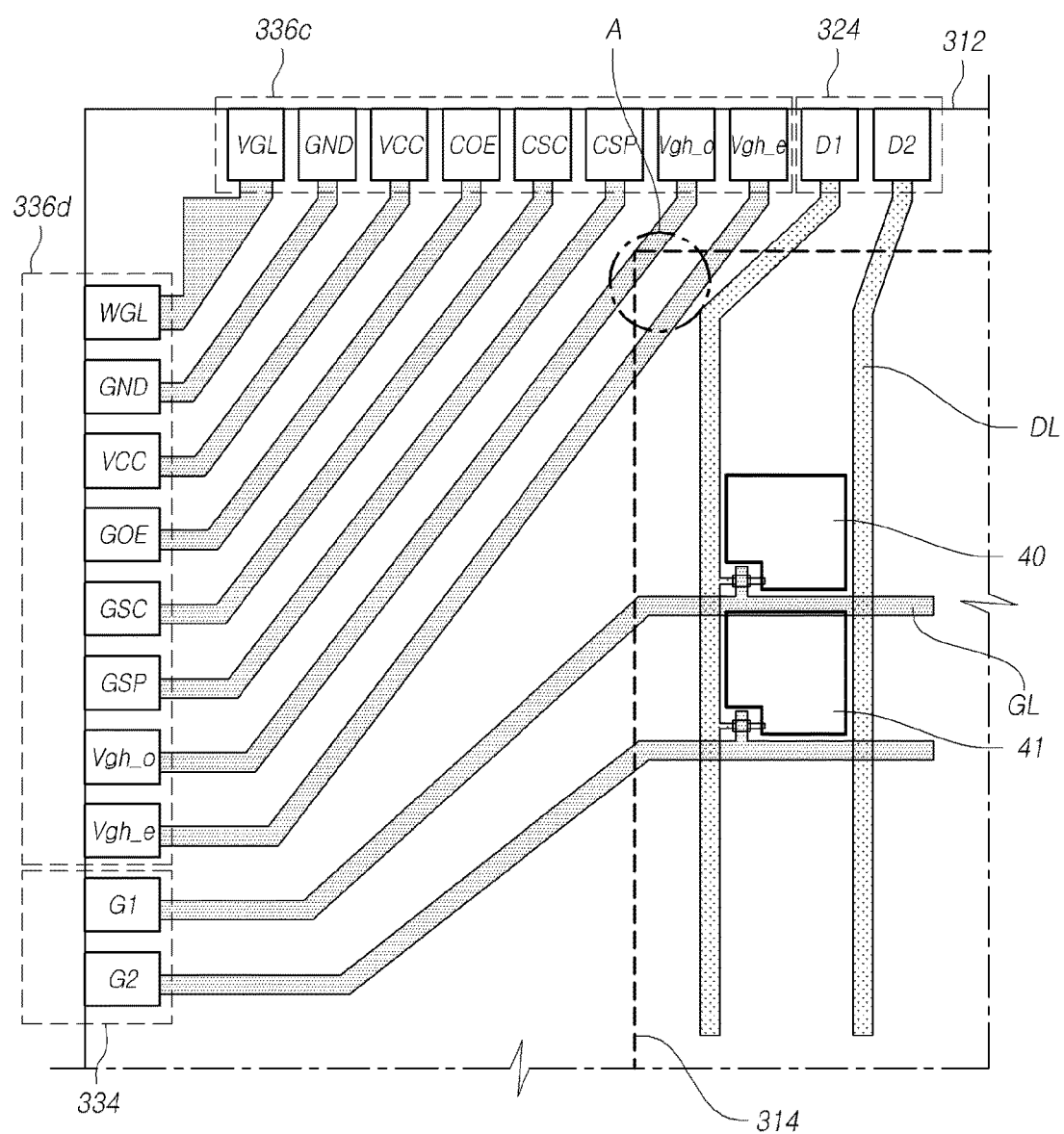
FIG. 4 schematically illustrates the configuration of a group of transmission lines in a corner of the display panel illustrated in FIG. 3.

FIG. 3 is a plan view illustrating some components and lines of the display device illustrated in FIG. 1, and FIG. 4 schematically illustrates the configuration of a group of transmission lines at a corner of the display panel illustrated in FIG. 3.

As illustrated in FIG. 3, the display device 300 includes a display panel 310, integrated data driver ICs 320, and gate driver ICs 330.

For example, each of the integrated data driver ICs 320 and each of the gate driver ICs 330 may be connected to the display panel 310 by being mounted on a data tape carrier package (TCP) and a gate TCP, respectively, or may be mounted on the display panel 310 by a chip on glass (COG) processing. Here, the data driver ICs 320 and the gate driver ICs 330, connected to the display panel 310 via the TCPs by TAB processing, receive control signals and driving voltages supplied by external sources and a connected to each other via signal lines formed on a PCB 342 connected to the TCPs.

In addition, as illustrated in FIG. 4, the display device 300 has data pads 324 and gate pads 334 disposed thereon, and pixels 40, 41 are disposed where the data lines DL and the gate lines GL intersect each other. The data pads 324 extend from the data linesDL, allowing data signals D1, D2, . . . , and so on to be transferred to the data lines DL therethrough. The gate pads 334 extend from the gate lines GL, allowing gate signals G1, G2, . . . , and so on to be transferred to the gate lines GL therethrough.

Signal lines connected to the gate driver ICs 330 mounted on the display panel 310 and signal lines connected to the data driver ICs 320 may be formed on a substrate 312 by a line on glass (LOG) processing.

In addition, the signal lines connected to the gate driver ICs 330 and the signal lines connected to the data driver ICs 320 are connected to each other and have control signals and driving voltages supplied by a controller 340 and a power supply 350.

Specifically, a group of transmission lines 336 are disposed at the corner of the display panel 310, such that gate control signals or gate driving signals to be supplied to the gate driver ICs 330 are transmitted therethrough.

In particular, first gate driving signal transmission lines 326 are additionally formed on a single data TCP 332 to be electrically connected to the group of transmission lines 336 on the display panel 310.

The first gate driving signal transmission lines 326 allow the gate driving signals, supplied by the controller 340 and the power supply 350 via the PCB 342, to be supplied to the group of transmission lines 336 therethrough.

Each of the gate driver ICs 330 are mounted on a gate TCP 332. Second gate driving signal transmission lines 338, electrically connected to the gate driver IC 330, and output lines 339a, including output pads, are formed on the gate TCP 332.

The second gate driving signal transmission lines 338 are electrically connected to the group of transmission lines 336 on the display panel 310. The output pads of the output lines 339a are electrically connected to the gate pads 334 on the display panel 310.

The gate driver ICs 330 sequentially supply gate signals, i.e. gate high voltages Vgh, to the gate lines GL in response to control signals input thereto. In addition, the gate driver ICs 330 supply gate low voltages Vgl to the gate lines GL in periods other than periods in which the gate high voltages Vgh are supplied.

As illustrated in FIG. 4, the group of transmission lines 336 may include lines through which DC voltage signals and gate control signals are supplied. The DC voltage signals, supplied by the power supply, include gate low voltages Vgl, ground voltage signals GND, gate high voltages Vgh, and power signals VCC. The gate control signals, supplied by the controller, include gate output enable (GOE) signals, gate shift clock (GSC) signals, and gate start pulses (GSPs). Although FIG. 4 illustrates the lines included in the group of transmission lines 336, the sequence of the lines included in the group of transmission lines 336 may be changed as desired.

First and second signal transmission pads 336c and 336d are disposed on both ends of the group of transmission lines 336.

As illustrated in FIG. 3, the second gate driving signal transmission lines 338 are electrically connected to another group of transmission lines 337 electrically connected to a gate driver IC 330a mounted on an adjacent TCP 332a. Similar to the group of transmission lines 336, the group of transmission lines 337 allows a variety of gate control signals to be supplied to adjacent gate driver ICs 330a therethrough. In other words, the group of transmission lines 337 may be disposed between two adjacent driver ICs 330a. As described above with reference to FIG. 2, the stage circuit of the shift register supplies first and second gate high voltages Vgh_o and Vgh_e to the gate lines GL by alternating the first and second gate high voltages Vgh_o and Vgh_e depending on frames. Thus, the group of signal lines 336 are signal lines through which gate high voltages Vgh are supplied, and include first and second gate high voltage lines 336a and 336b (shown in FIG. 5A to FIG. 7) through which the first and second gate high voltages Vgh_o and Vgh_e are supplied. Likewise, the group of signal lines 337 are signal lines through which the gate high voltages Vgh are supplied, and include first and second gate high voltage lines 336a and 336b (see FIG. 5A to FIG. 7) through which the first and second gate high voltages Vgh_o and Vgh_e are supplied.

Regarding the structure, at the corner of the display panel 310, the first and second gate high voltage lines 336a and 336b of the group of transmission lines 336 partially overlap a common electrode 314 included in the pixels of the display panel 310. As will be described later, the size of an area in which the second gate high voltage line 336b overlaps the common electrode 314 may be greater than the size of an area in which the first gate high voltage line 336a overlaps the common electrode 314. Also, the group of signal lines 337 may include signal lines through which the gate low voltages Vgl are supplied, and can include first and second gate low voltage lines. In the present disclosure, although the features of the first and second gate high voltage lines are disclosed, the same can be applied equally to first and second gate low voltage lines.

The first and second gate high voltage lines 336a and 336b of the group of transmission lines 337 partially overlap the common electrode 314 included in the pixels of the display panel 310 in the corner of the display panel 310. Similar to the group of transmission lines 336, the size of an area in which the second gate high voltage line 336b of the group of transmission lines 337 overlaps the common electrode 314 may be greater than the size of an area in which the first gate high voltage line 336a of the group of transmission lines 337 overlaps the common electrode 314.

Hereinafter, reference will be made to the relationship between the first and second gate high voltage lines 336a and 336b of the group of transmission lines 336 and the common electrode 314. Although the overlapping configuration of the first and second gate high voltage lines 336a and 336b and the common electrode 314 may be different, the group of transmission lines 337 can be applied in the same manner.

Figure 5A:
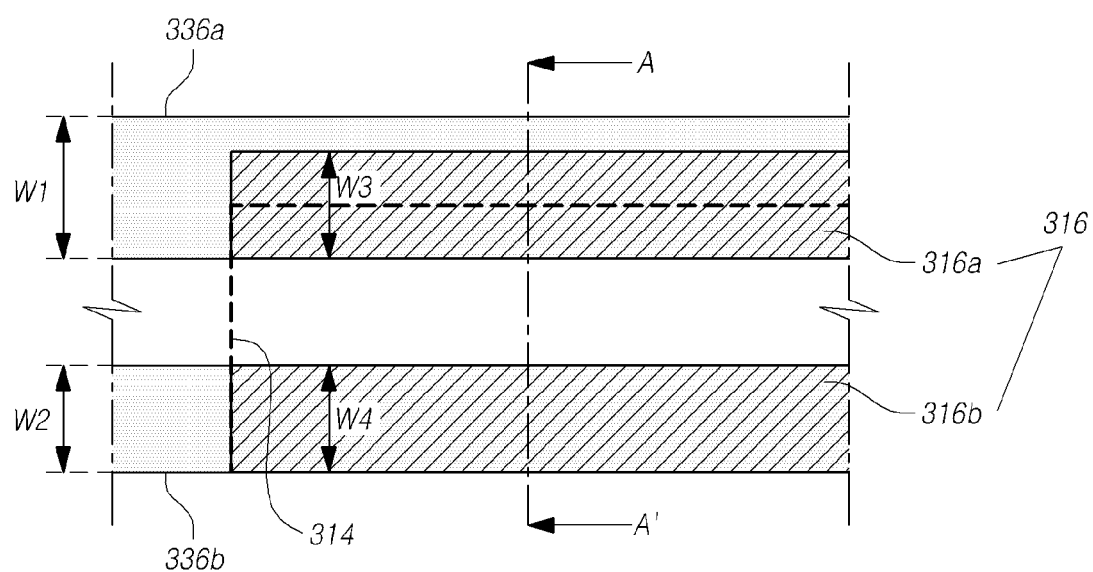
FIG. 5A is an enlarged view illustrating an area of an exemplary display device, corresponding to area A illustrated in FIG. 4.
Figure 5B:
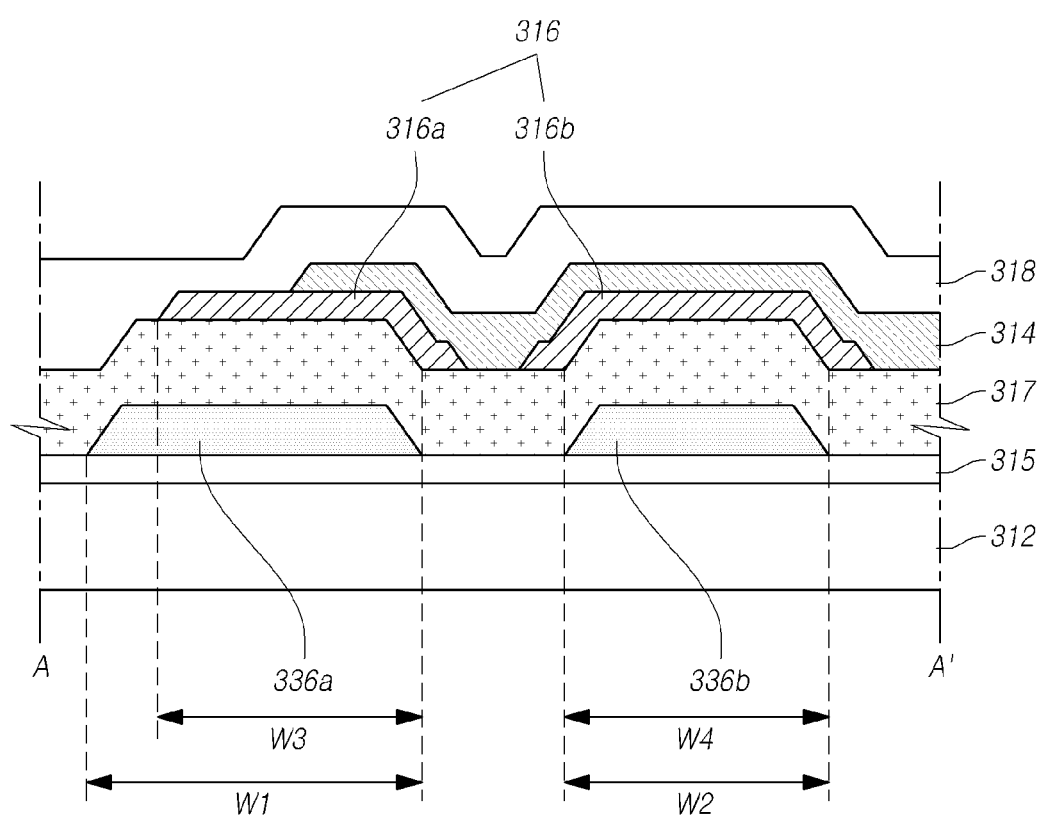
FIG. 5B is a cross-sectional view taken along line A-A' in FIG. 5A.

FIG. 5A is an enlarged view illustrating an area of an exemplary display device, corresponding to area A illustrated in FIG. 4, corresponding to area A illustrated in FIG. 4, and FIG. 5B is a cross-sectional view taken along line A-A' in FIG. 5A.

Referring to FIG. 5A and FIG. 5B, a first insulating film 315 is disposed on the substrate 312 of the display panel 310. The first and second gate high voltage lines 336a and 336b are disposed on the first insulating film 315. A second insulating film 317 is disposed on the first and second gate high voltage lines 336a and 336b. A connecting line structure 316 is disposed on the second insulating film 317, and includes a first connecting line 316a and a second connecting line 316b in positions corresponding to the first gate high voltage line 336a and the second gate high voltage line 336b.

Referring to the cross-sectional shape shown in FIG. 5A and FIG. 5B, the common electrode 314 is positioned on a portion of the first connecting line 316a and on the entirety of the second connecting line 316b. Accordingly, only a portion of the first connecting line 316a is in contact with the common electrode 314, whereas the entirety of the second connecting line 316b is in contact with the common electrode 314. A portion of a third insulating film 318 is positioned between the first connecting line 316a and the second connecting line 316b.

As illustrated in FIG. 5A, the width W1 of the first gate high voltage line 336a is greater than the width W2 of the second gate high voltage line 336b. The width W3 of the first connecting line 316a is less than the width W1 of the first gate high voltage line 336a The width W4 of the second connecting line 316b is substantially equal to the width W2 of the second gate high voltage line 336b (W2=W4 or W2≈W4) or differs from the width W2 of the second gate high voltage line 336b, as long as the difference is not greater than the processing margin (W2=W4+Δα, where Δα is the process margin). In the latter case, although the width of an opening of a mask used in the formation of the second gate high voltage line 336b is equal or substantially equal to the width of an opening of a mask used in the formation of the second connecting line 316b, the width of the second connecting line 316b may differ from the width W2 of the second gate high voltage line 336b due to differences in fabrication process, processing margins, or so on.

The term "the same or substantially the same length, width, or area" used herein is interpreted as meaning that the length, width, or area may be variable within the range of a processing margin throughout the present disclosure.

The width W3 of the first connecting line 316a is equal or substantially equal to the width W4 of the second connecting line 316b.

Referring to the cross-sectional shape, the common electrode 314 overlaps only a portion of the first gate high voltage line 336a and the entirety of the second gate high voltage line 336b. The width W1 of the first gate high voltage line 336a is greater than the width W2 of the second gate high voltage line 336b, while the width W3 of the of the first connecting line 316a and the width W4 of the second connecting line 316b, both of which are in contact with the common electrode 314, are equal or substantially equal to each other. Thus, the size of area S1 in which both the common electrode 314 and the first connecting line 316a overlap the first gate high voltage line 336a may be equal or substantially equal to the size of area S2 in which both the common electrode 314 and the second connecting line 316b overlap the second gate high voltage line 336b.

Figure 6A:
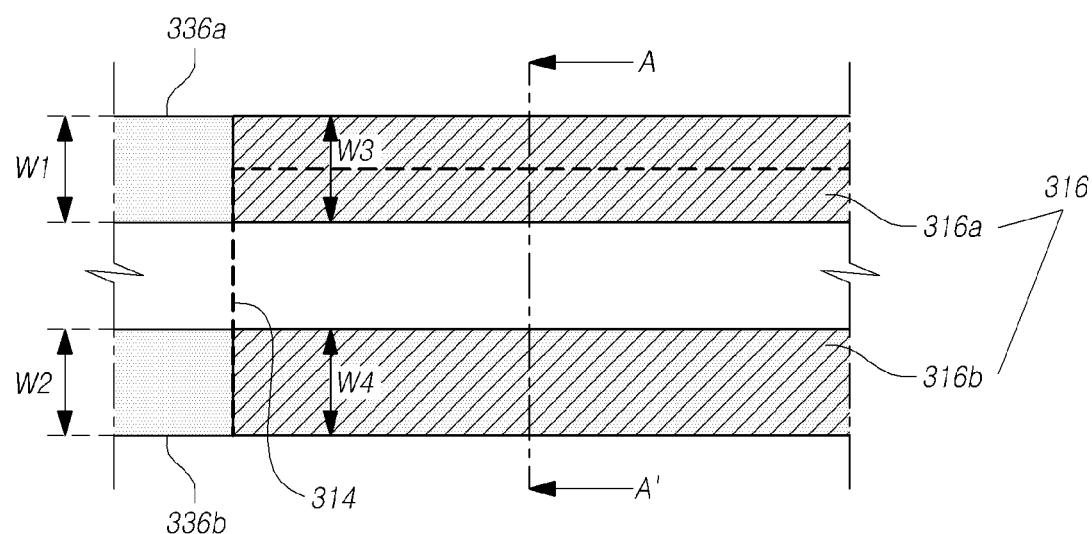
FIG. 6A is an enlarged view illustrating an area of another exemplary display device, corresponding to area A illustrated in FIG. 4.
Figure 6B:
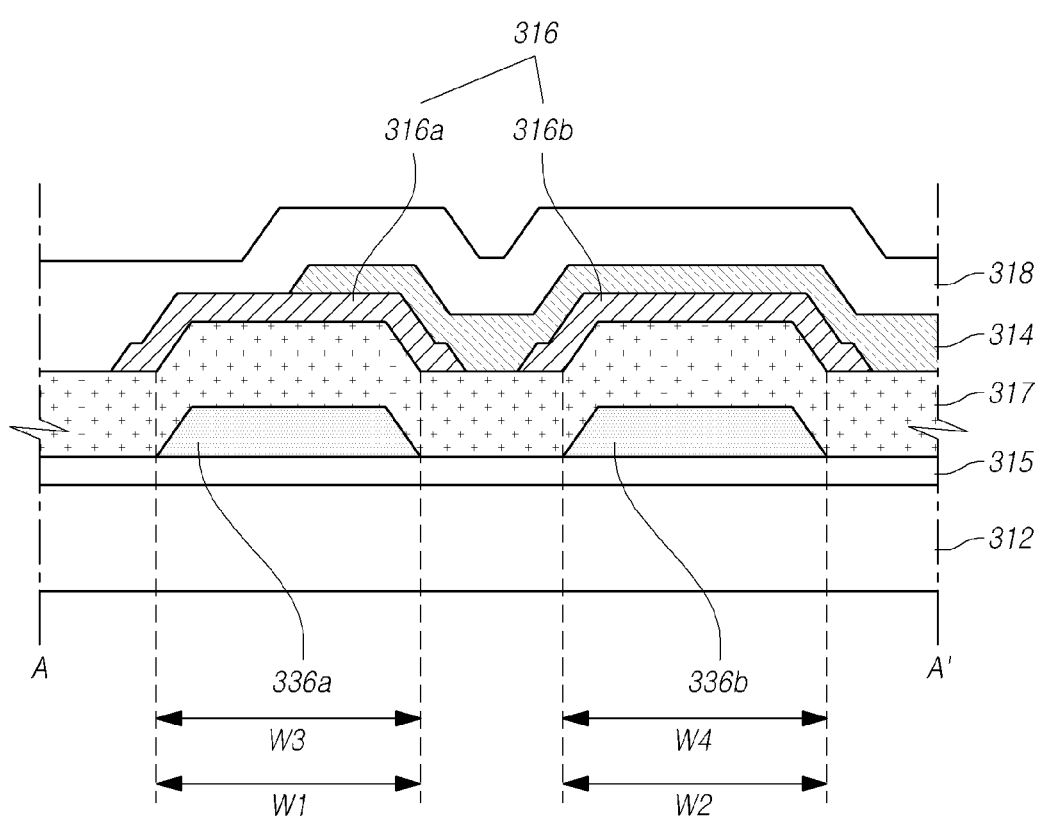
FIG. 6B is a cross-sectional view taken along line A-A' in FIG. 6A.

FIG. 6A is an enlarged view illustrating an area of another exemplary display device, corresponding to area A illustrated in FIG. 4, and FIG. 6B is a cross-sectional view taken along line A-A' in FIG. 6A.

Referring to the cross-sectional shape illustrated in FIG. 6A and FIG. 6B, the common electrode 314 of the pixels is positioned on a portion of the first connecting line 316a and the entirety of the second connecting line 316b. Accordingly, only a portion of the first connecting line 316a is in contact with the common electrode 314, while the entirety of the second connecting line 316b is in contact with the common electrode 314.

As illustrated in FIG. 6A and FIG. 6B, the width WI of the first gate high voltage line 336a is equal to the width W2 of the second gate high voltage line 336b. The width W3 of the first connecting line 316a is equal to the width WI of the first gate high voltage line 336a. The width W4 of the second connecting line 316b is substantially equal to the width W2 of the second gate high voltage line 336b (W2=W4 or W2≈W4). The width W3 of the first connecting line 316a is equal or substantially equal to the width W4 of the second connecting line 316b.

Referring to the cross-sectional shape, the common electrode 314 overlaps only a portion of the first gate high voltage line 336a and overlaps the entirety of the second gate high voltage line 336b. The width W3 of the of the first connecting line 316a and the width W4 of the second connecting line 316b, both of which are in contact with the common electrode 314, are equal or substantially equal to each other. Thus, the size of an area S1 in which both the common electrode 314 and the first connecting line 316a overlap the first gate high voltage line 336a is equal or substantially equal to the size of an area S2 in which both the common electrode 314 and the second connecting line 316b overlap the second gate high voltage line 336b.

Figure 7:
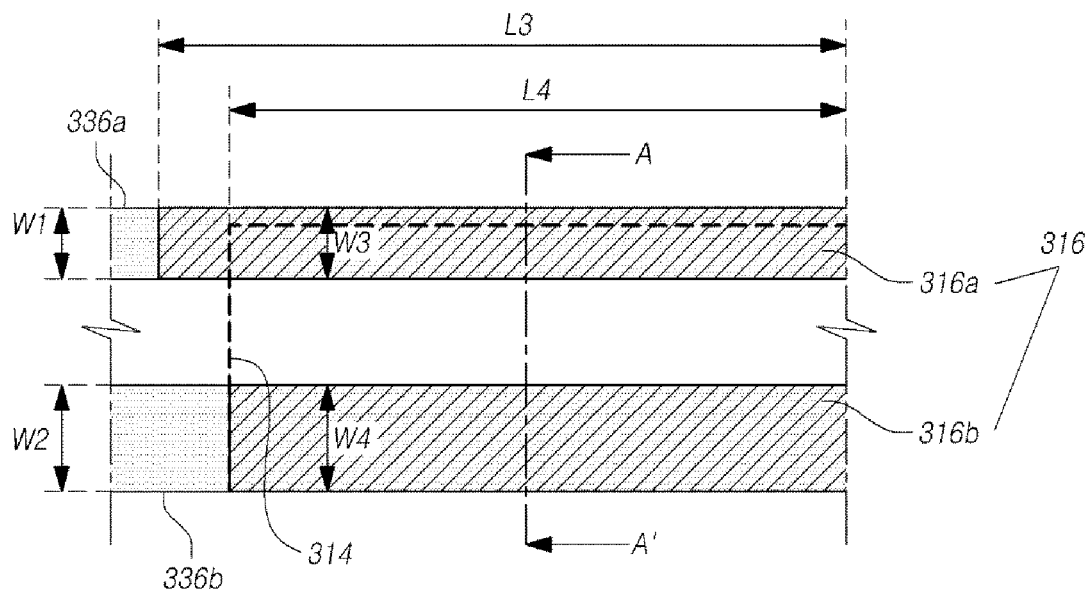
FIG. 7 is an enlarged view illustrating an area of further another exemplary display device, corresponding to area A illustrated in FIG. 4.

FIG. 7 is an enlarged view illustrating an area of further another exemplary display device, corresponding to area A illustrated in FIG. 4.

Referring to FIG. 7, the common electrode 314 of the pixels is positioned on a portion of the first connecting line 316a and the entirety of the second connecting line 316b. Accordingly, only a portion of the first connecting line 316a is in contact with the common electrode 314, whereas the entirety of the second connecting line 316b is in contact with the common electrode 314.

The width W1 of the first gate high voltage line 336a is less than the width W2 of the second gate high voltage line 336b. The width W3 of the first connecting line 316a is equal or substantially equal to the width W1 of the first gate high voltage line 336a. The width W4 of the second connecting line 316b is equal or substantially equal to the width W2 of the second gate high voltage line 336b. Consequently, the width W3 of the first connecting line 316a is less than the width W4 of the second connecting line 316b.

Referring to the cross-sectional shape, the common electrode 314 overlaps only a portion of the first gate high voltage line 336a and overlaps the entirety of the second gate high voltage line 336b. The width W1 of the first gate high voltage line 336a is less than the width W2 of the second gate high voltage line 336b. The length L3 of the first connecting line 316a is greater than the length L4 of the second connecting line 316b, wherein the first and second connecting lines 316a and 316b are in contact with the common electrode 314. Thus, the size of an area (S1≅ W3×L3) in which both the common electrode 314 and the first connecting line 316a overlap the first gate high voltage line 336a is equal or substantially equal to the size of an area (S2=W4×L4) in which the common electrode 314 and the second connecting line 316b overlap the second gate high voltage line 336b.

The first connecting line 316a and the second connecting line 316b described with reference to FIG. 5A to FIG. 7 may be formed of the same material or different materials. The first connecting line 316a and the second connecting line 316b may be formed of the same material and by the same process as a single layer of the pixels P of the display panel 310 illustrated in FIG. 3. For example, the first connecting line 316a and the second connecting line 316b may be formed of the same material as the sources and the drains of the transistors of the pixels P and may be formed by the process of forming the sources and the drains of the transistors. Alternatively, the first connecting line 316a and the second connecting line 316b may be formed of the same material as pixel electrodes of the pixels P and may be formed by the process of forming the pixel electrodes.

Figure 8:
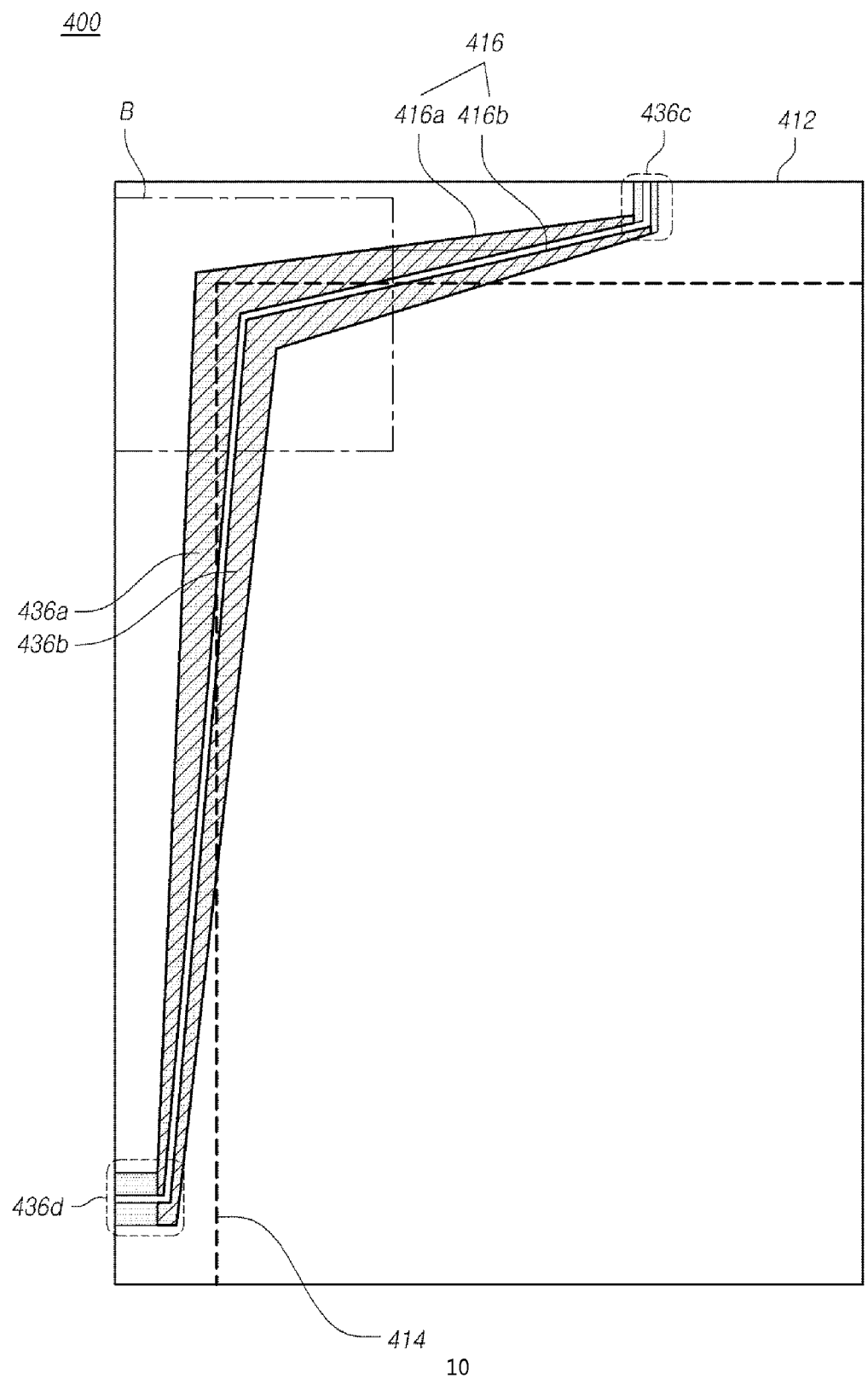
FIG. 8 schematically illustrates the configuration of first and second gate high voltage lines included in a group of transmission lines disposed in a corner of the display panel illustrated in FIG. 3.

FIG. 8 schematically illustrates the configuration of first and second gate high voltage lines included in the group of transmission lines disposed at a corner of the display panel illustrated in FIG. 3. In FIG. 8, the other lines and the pads included in the group of transmission lines are omitted for the sake of brevity.

As illustrated in FIG. 8, a display device 400 according to still another exemplary embodiment includes first and second gate high voltage lines 436a and 436b allowing first and second gate high voltages Vgh_o and Vgh_e to be supplied therethrough to signal lines through which gate high voltages Vgh are supplied. The first and second gate high voltage lines 436a and 436b are bent at obtuse angles in the direction of a common electrode 414. First and second gate high voltage pads 436c and 436d are disposed on both ends of the first and second gate high voltage lines 436a and 436b.

Referring to the structure, the first gate high voltage line 436a and the second gate high voltage line 436b partially overlap the common electrode 414 included in the pixels P of the display panel 310.

Figure 9A:
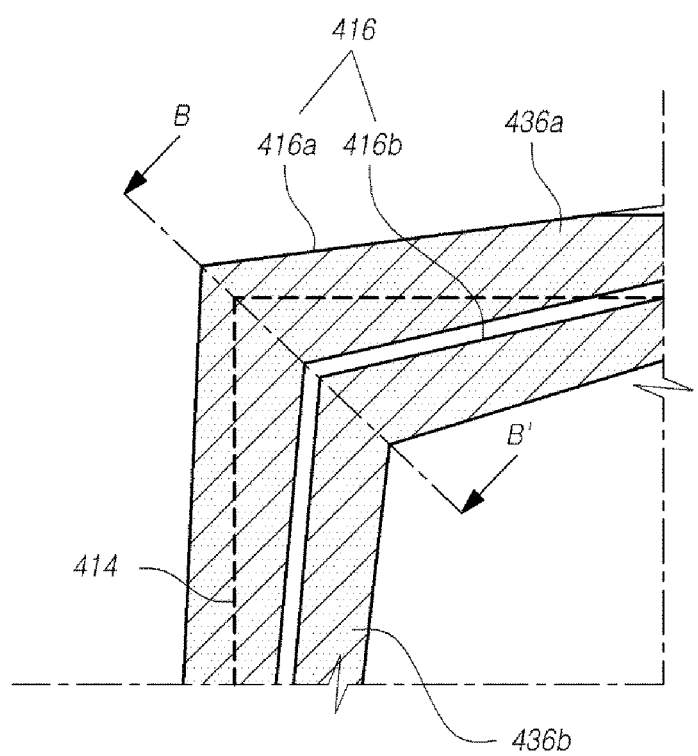
FIG. 9A is an enlarged plan view illustrating an area of an exemplary display device, corresponding to area B illustrated in FIG. 8.
Figure 9B:
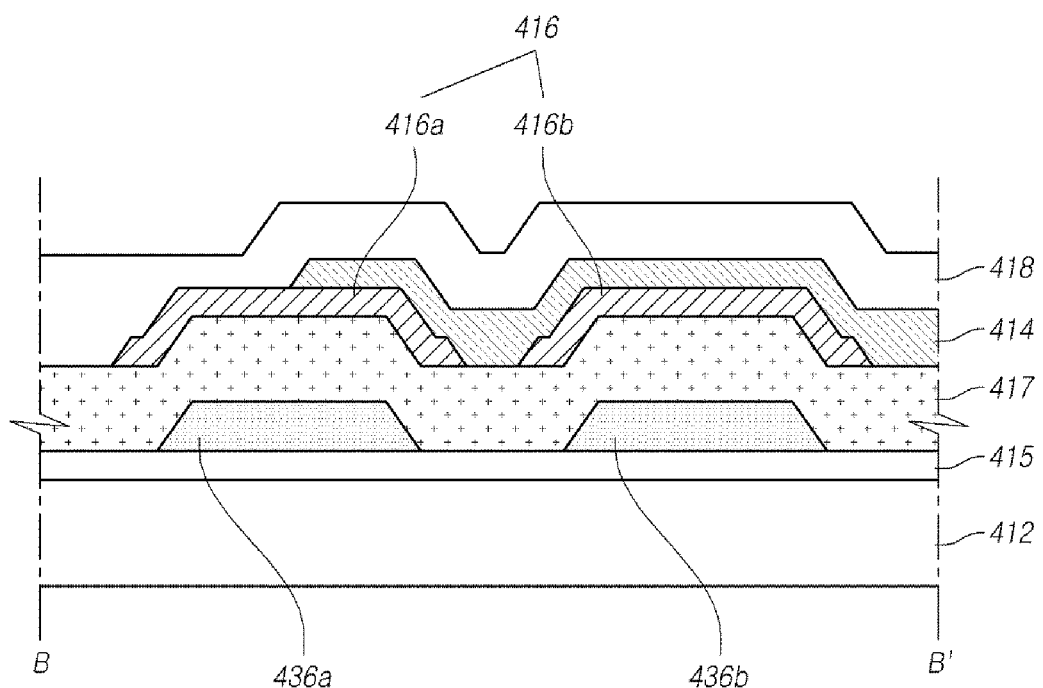
FIG. 9B is a cross-sectional view taken along line B-B' in FIG. 9A.

FIG. 9A is an enlarged plan view illustrating an area of an exemplary display device, corresponding to area B illustrated in FIG. 8, and FIG. 9B is a cross-sectional view taken along line B-B' in FIG. 9A.

Referring back to FIG. 9A and FIG. 9B, a first insulating film 415 is disposed on a substrate 412. The first gate high voltage line 436a and the second gate high voltage line 436b are disposed on the first insulating film 415. A second insulating film 417 is disposed on the first gate high voltage line 436a and the second gate high voltage line 436b. A connecting line structure 416 is formed on the second insulating film 417, with a first connecting line 416a and a second connecting line 416b thereof being disposed in positions respectively corresponding to the first gate high voltage line 436a and the second gate high voltage line 436b.

Referring to the cross-sectional shape, the common electrode 414 of the pixels is disposed on a portion of the first connecting line 416a and the entirety of the second connecting line 416b. Accordingly, only a portion of the first connecting line 316a is in contact with the common electrode 414, whereas the entirety of the second connecting line 416b is in contact with the common electrode 414. A third insulating film 418 is disposed on the first connecting line 416a and the second connecting line 416b.

As illustrated in FIG. 8 and FIG. 9A, the first connecting line 416a has a configuration substantially identical to the overall configuration of the first gate high voltage line 436a, bent at an obtuse angle. Similarly, the second connecting line 416b has a configuration substantially identical to the overall configuration of the second gate high voltage line 436b, bent at an obtuse angle.

The width WI of the first gate high voltage line 436a is equal to the width W2 of the second gate high voltage line 436b. The width W3 of the first connecting line 416a is equal to the width WI of the first gate high voltage line 436a. The width W4 of the second connecting line 416b is substantially equal to the width W2 of the second gate high voltage line 436b (W2=W4 or W2≈W4). The width W3 of the first connecting line 416a is equal or substantially equal to the width W4 of the second connecting line 416b.

Referring to the cross-sectional shape, the common electrode 414 overlaps only a portion of the first gate high voltage line 436a and the entirety of the second gate high voltage line 436b. The width W3 of the first connecting line 416a and the width W4 of the second connecting line 416b, both of which are in contact with the common electrode 414, are substantially equal. Thus, the size of an area S1 in which both the common electrode 414 and the first connecting line 416a overlap the first gate high voltage line 436a is equal or substantially equal to the size of an area S2 in which the common electrode 314 and the second connecting line 316b overlap the second gate high voltage line 436b.

Figure 10A:
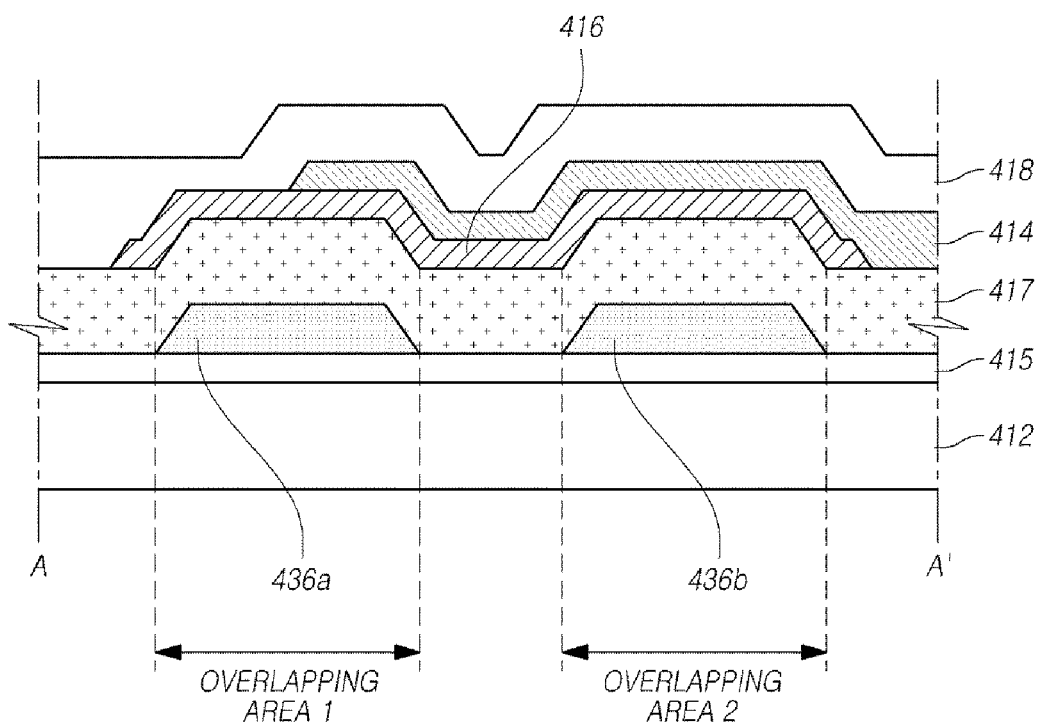
FIG. 10A and FIG. 10B are cross-sectional views of other exemplary embodiments, corresponding to the cross-section taken along line B-B' in FIG. 9A.
Figure 10B:
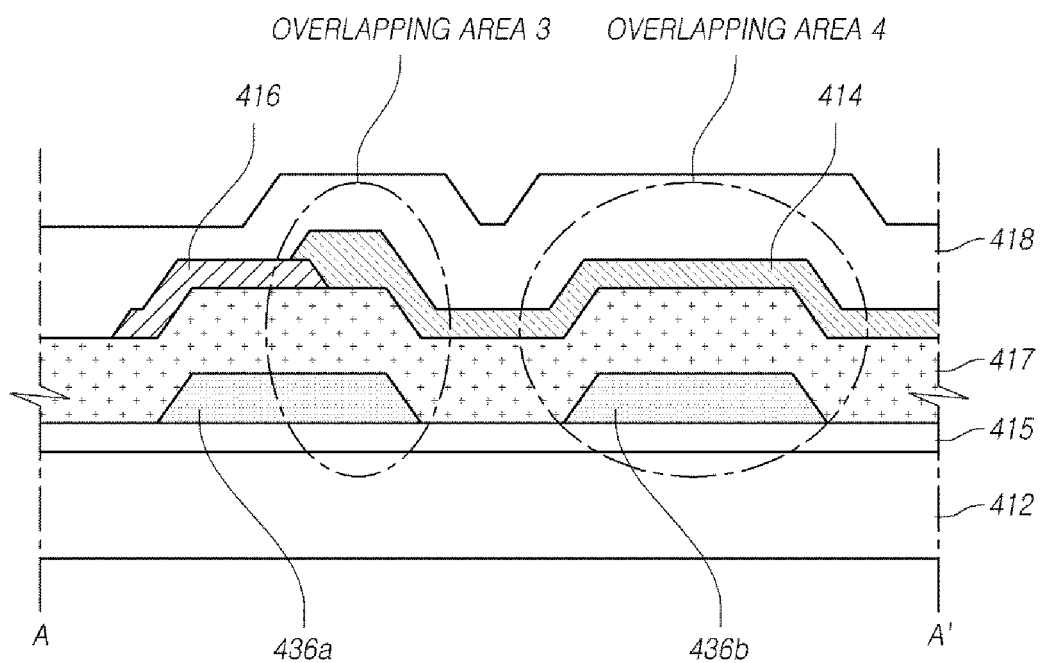

FIG. 10A and FIG. 10B are cross-sectional views of other exemplary embodiments, corresponding to the cross-section taken along line B-B' in FIG. 9A.

In the embodiment previously disclosed, the connecting line structure 416 has been described such that the first connecting line 416a and the second connecting line 416b are separated from each other. In contrast, as illustrated in FIG. 10A and FIG. 10B, the first and second connecting lines (416a, 416b) of the connecting line structure 416 are connected to each other or only a portion of the first connecting line (416a) of the connecting line structure 416 is present.

Referring to FIG. 10A, the connecting line structure 416 is formed by connecting the first connecting line 416a and the second connecting line 416b illustrated in FIG. 9B to each other. A portion of the connecting line structure 416 is in contact with the common electrode 414.

Specifically, the connecting line structure 416 extends from the second gate high voltage line 436b to the outermost point of the common electrode 414 and from the outermost point of the common electrode 414 to the outermost point of the first gate high voltage line 436a. Thus, AREA 2 in which a first portion of the connecting line structure 416 overlaps the second gate high voltage line 436b is substantially equal to AREA 1 in which a second portion of the connecting line structure 416 overlaps the first gate high voltage line 436b.

Referring to FIG. 10B, the first connecting line structure 416 only corresponds to the first connecting line 416a illustrated in FIG. 9A, with a portion of the first connecting line structure 416 being in contact with the common electrode 414. Specifically, the connecting line structure 416 extends from the outermost point of the common electrode 414 to the outermost point of the first gate high voltage line 436a. The connecting line structure 416 extends from the common electrode 414 in a direction toward a position in which the common electrode 414 does not overlap the first gate high voltage line 436a and is not formed in a position in which the common electrode 414 overlaps the first gate high voltage line 436a or the second gate high voltage line 436b.

AREA 4 in which a first portion of the common electrode 414 overlaps the second gate high voltage line 436b is substantially equal to AREA 3 in which a second portion of the common electrode 414 overlaps the first gate high voltage line 436b.

Each of the connecting line structures 316 has been described, with reference to FIG. 5A to FIG. 7, as the first connecting line 316a and the second connecting line 316b separated from each other, like the first and second connecting lines 416a and 416b illustrated in FIG. 9A and FIG. 9B. In contrast, like the connecting line structure 416 illustrated in FIG. 10A and FIG. 10B, the connecting line structure 316 may be configured such that the first connecting line 316a and the second connecting line 316b are connected to each other or only the first connecting line 316a is present.

The width of the first connecting line 416a and the width of the second connecting line 416b of the connecting line structure 416 have been described, with reference to FIG. 8 to FIG. 10B, as being equal to the width of the first gate high voltage line 436a and the width of the second gate high voltage line 436b, respectively. In contrast, as illustrated in FIG. 5A, FIG. 5B, FIG. 7A, and FIG. 7B, the width of the first gate high voltage line 436a may differ from the width of the second gate high voltage line 436b, and the width of the first connecting line 416a may be equal to or different from the width of the second connecting line 416b.

Figure 11:
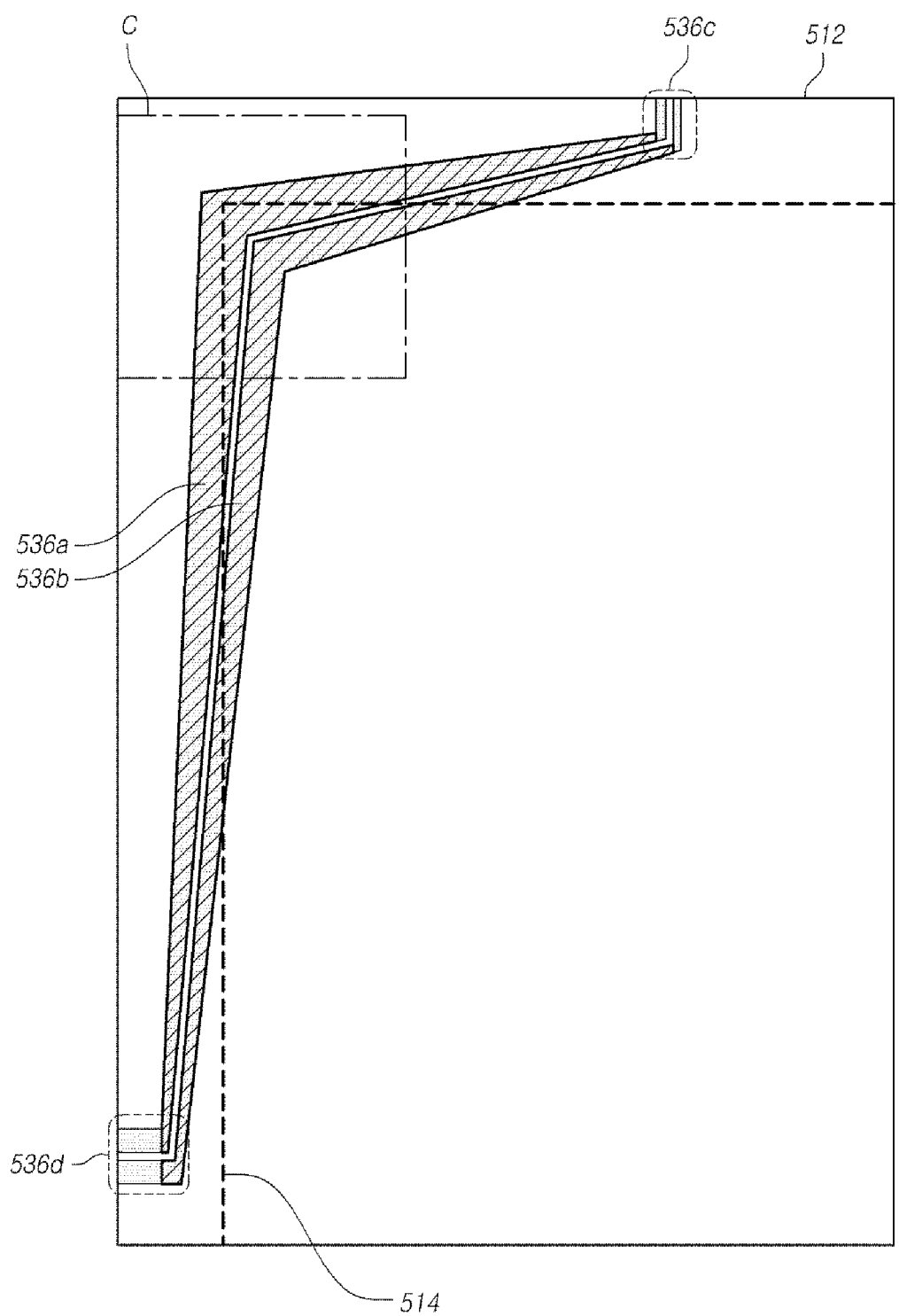
FIG. 11 schematically illustrates the configuration of first and second gate high voltage lines of a group of transmission lines disposed in a corner of a display panel of a display device according to another embodiment, in which no connecting lines are disposed in the corner of the display panel.
Figure 12A:
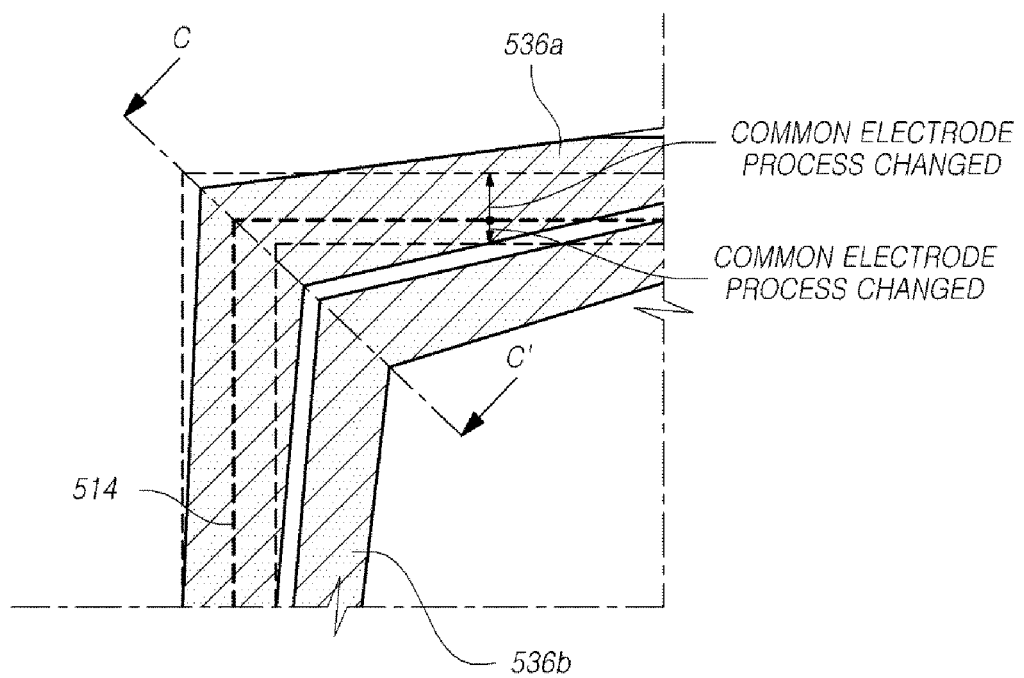
FIG. 12A is an enlarged plan view of area C in FIG. 11.

FIG. 11 schematically illustrates the configuration of first and second gate high voltage lines of a group of transmission lines disposed at a corner of a display panel of a display device according to another embodiment, in which no connecting lines are disposed at the corner of the display panel. FIG. 12A is an enlarged plan view of area C in FIG. 11, and FIG. 12B is a cross-sectional view taken along line C-C' in FIG. 12A.

Figure 12B:
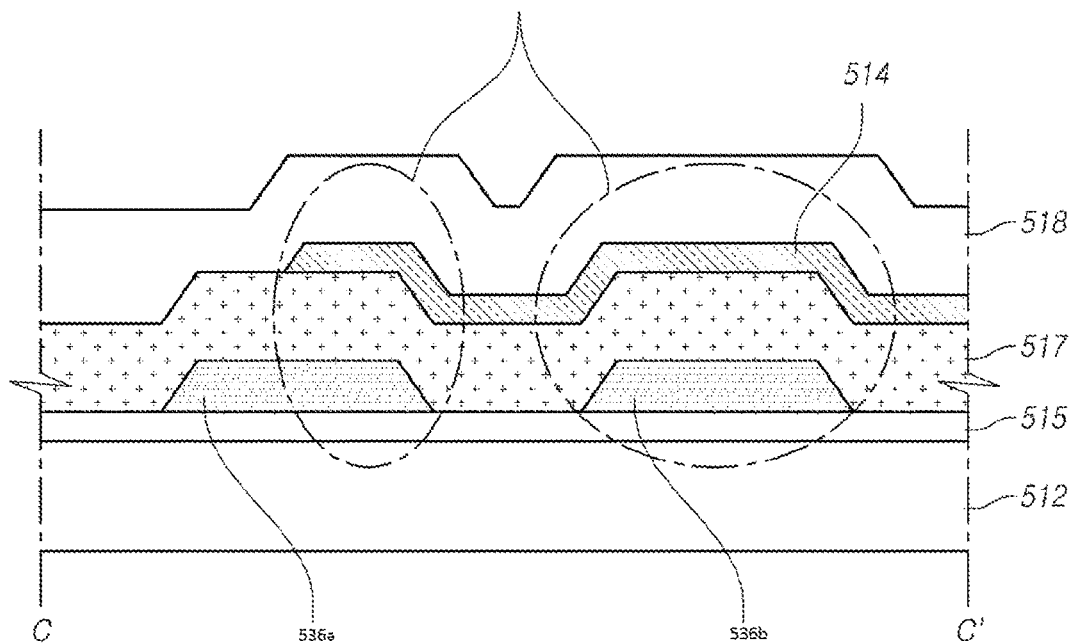
FIG. 12B is a cross-sectional view taken along line C-C' in FIG. 12A.

Referring to FIG. 11, FIG. 12A, and FIG. 12B, the display device 500 includes a first insulating film 515, a first gate high voltage line 436a, a second gate high voltage line 436b, a second insulating film 517, and a common electrode 514 disposed on a substrate 512, in which the first gate high voltage line 436a and the second gate high voltage line 436b are bent at obtuse angles, and first and second gate high voltage pads 436c and 436d are disposed on both ends of the first gate high voltage line 436a and the second gate high voltage line 436b. These features of the display device 500 are identical to those of the display device 400 described with reference to FIG. 9, FIG. 10A, and FIG. 10B.

Unlike the display device 400 described with reference to FIG. 9, FIG. 10A, and FIG. 10B, the display device 500 shown in FIG. 11 does not include the connecting line structure 416.

In the display device 500, areas in which the common electrode 514, the first gate high voltage line 536a, and the second gate high voltage line 536b overlap one another may be defined in different portions and with different sizes. Due to such differences, different parasitic capacitance elements are introduced between the first gate high voltage line 536a and the common electrode 514 and between the second gate high voltage line 536b and the common electrode 514, and differences in RC loads may occur.

In addition, different parasitic capacitance elements may be introduced and different RC loads may occur between the first gate high voltage line 536a and the common electrode 514 and between the second gate high voltage line 536b and the common electrode 514. Due to such different parasitic capacitance elements and RC loads, stains may occur in the horizontal lines of odd numbered frames or even numbered frames formed due to differences in the first gate high voltage lines 536a and the second gate high voltage lines 536b.

In contrast, the display device 400 according to the exemplary embodiment as described above can make the same parasitic capacitance introduced between the first gate high voltage line 436a and the common electrode 414 and between the second gate high voltage line 436b and the common electrode 414, using areas or the sizes of areas in which a conductive structure including (1) the first connecting line 416a, the second connecting line 416, and the common electrode 414, (2) the connecting line 416 and the conductive electrode 414, or (3) the first connecting line 416a and the common electrode 414 overlaps the first gate high voltage line 436a and the second gate high voltage line 436b. In addition, RC loads between the common electrode 414 and the first gate high voltage line 436a and between common electrode 414 and the second gate high voltage line 436b are not influenced by the processing margin of the common electrode 414, whereby horizontal line stains occurring in odd numbered frames or even numbered frames due to differences in the first gate high voltage lines 436a and the second gate high voltage lines 436b may be reduced.

According to the exemplary embodiments as described above, it is possible to supply the same gate high voltage through two gate high voltage lines regardless of the shapes, positions, or structures of the two gate high voltage lines.

The foregoing descriptions and the accompanying drawings have been presented in order to explain the certain principles of the present disclosure. A person skilled in the art to which the disclosure relates could make many modifications and variations by combining, dividing, substituting for, or changing the elements without departing from the principle of the disclosure. The foregoing embodiments disclosed herein shall be interpreted as illustrative only but not as limitative of the principle and scope of the disclosure. It should be understood that the scope of the disclosure shall be defined by the appended claims and all of their equivalents fall within the scope of the disclosure.

What is claimed is:

1. A display device comprising:
   two or more pixels disposed in a pixel area in which two or more data lines intersect two or more gate lines;
   a common electrode commonly disposed on the pixels;
   a first gate voltage line through which a first gate high voltage is supplied, a portion of the first gate voltage line overlapping the common electrode;
   a second gate voltage line through which a second gate high voltage is supplied, a portion of the second gate voltage line overlapping the common electrode; and
   a connecting line structure in contact with the common electrode, the connecting line structure extending from the common electrode in a direction toward a position in which the common electrode does not overlap the first gate voltage line.

2. The display device of claim 1, wherein a size of an area in which the second gate voltage line overlaps the common electrode is greater than a size of an area in which the first gate voltage line overlaps the common electrode.

3. The display device of claim 1, wherein a width of the first gate voltage line is greater than a width of the second gate voltage line, and a width of the connecting line structure is equal to the width of the second gate voltage line.

4. The display device of claim 1, wherein a width of the first gate voltage line is equal to a width of the second gate voltage line, and a width of the connecting line structure is equal to the width of the second gate voltage line.

5. The display device of claim 1, wherein a width of the first gate voltage line is less than a width of the second gate voltage line, a width of the connecting line structure is equal to the width of the second gate voltage line, the connecting line structure extends in a direction of the first gate voltage line.

6. The display device of claim 1, wherein the connecting line structure comprises a first connecting line disposed over the first gate voltage line and a second connecting line disposed over the second gate voltage line, the second connecting line being separated from the first connecting line.

7. The display device of claim 1, wherein the connecting line structure is disposed over the first gate voltage line and the second gate voltage line.

8. The display device of claim 1, wherein the connecting line structure extends from the common electrode in a direction toward a position in which the common electrode does not overlap the first gate voltage line and is not disposed in a position in which the common electrode overlaps the first gate voltage line or the second gate voltage line.

9. The display device of claim 1, wherein a size of an area in which the common electrode and the connecting line structure overlap the first gate voltage line is equal to a size of an area in which the common electrode and the connecting line structure overlap the second gate voltage line.

10. The display device of claim 1, wherein capacitance formed between the common electrode and the first gate voltage line and between the connecting line structure and the first gate voltage line is identical to capacitance formed between the common electrode and the second gate voltage line and between the connecting line structure and the second gate voltage line.

11. The display device of claim 1, wherein a shape of the connecting line structure is identical to a shape of the first gate voltage line and the second gate voltage line, and the connecting line structure is disposed on the first gate voltage line and the second gate voltage line.

12. A display device comprising:
    a plurality of pixels located at a pixel area where a plurality of data lines respectively intersects a plurality of gate lines;
    a common electrode positioned on the pixels;
    a first gate voltage line vertically overlapping at least a portion of the common electrode;
    a second gate voltage line vertically overlapping at least a portion of the common electrode; and
    a connecting line structure in contact with the common electrode, wherein the connecting line structure includes first and second connecting lines, only a portion of the first connecting line is in contact with the common electrode and the entire portion of the second connecting line is in contact with the common electrode, so that substantially the same capacitance is generated between the first gate voltage line and the common electrode, and between the second voltage line and the common electrode when first and second high voltages are supplied to the first and second high voltage lines.

13. The display device of claim 12, wherein a size of an area in which the second gate voltage line overlaps the common electrode is greater than a size of an area in which the first gate voltage line overlaps the common electrode.

14. The display device of claim 12, wherein a width of the first gate voltage line is greater than a width of the second gate voltage line, and a width of the connecting line structure is equal to the width of the second gate voltage line.

15. The display device of claim 12, wherein a width of the first gate voltage line is equal to a width of the second gate voltage line, and a width of the connecting line structure is equal to the width of the second gate voltage line.

16. The display device of claim 12, wherein a width of the first gate voltage line is less than a width of the second gate voltage line, a width of the connecting line structure is equal to the width of the second gate voltage line, the connecting line structure extends in a direction of the first gate voltage line.

17. The display device of claim 12, wherein the connecting line structure extends from the common electrode in a direction toward a position in which the common electrode does not overlap the first gate voltage line and is not disposed in a position in which the common electrode overlaps the first gate voltage line or the second gate voltage line.

18. The display device of claim 12, wherein a size of an area in which the common electrode and the connecting line structure overlap the first gate voltage line is equal to a size of an area in which the common electrode and the connecting line structure overlap the second gate voltage line.

19. The display device of claim 12, wherein a shape of the connecting line structure is identical to a shape of the first gate voltage line and the second gate voltage line, and the connecting line structure is disposed on the first gate voltage line and the second gate voltage line.

\* \* \* \* \*